(12) United States Patent
Kashyap et al.

(10) Patent No.: US 8,730,629 B2
(45) Date of Patent: May 20, 2014

(54) VARIABLE BREAKDOWN TRANSIENT VOLTAGE SUPPRESSOR

(75) Inventors: Avinash Srikrishnan Kashyap, Clifton Park, NY (US); Stanislav Ivanovich Soloviev, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/334,598

(22) Filed: Dec. 22, 2011

(65) Prior Publication Data

US 2013/0163139 A1 Jun. 27, 2013

(51) Int. Cl.
*H02H 3/22* (2006.01)

(52) U.S. Cl.
USPC .............................. 361/56; 361/111

(58) Field of Classification Search
USPC ................ 361/56, 111; 257/355–360
See application file for complete search history.

(56) References Cited

U.S. PATENT DOCUMENTS

| | | | |
|---|---|---|---|
| 5,880,511 | A | 3/1999 | Yu et al. |
| 6,392,266 | B1 | 5/2002 | Robb et al. |
| 6,734,462 | B1 * | 5/2004 | Shah ............................ 257/77 |
| 7,510,903 | B1 | 3/2009 | Matteson et al. |
| 7,800,174 | B2 * | 9/2010 | Yamaguchi et al. .......... 257/341 |
| 8,294,507 | B2 * | 10/2012 | Zhang et al. .................. 327/440 |
| 2001/0017389 | A1 | 8/2001 | Hurkx et al. |
| 2003/0010995 | A1 | 1/2003 | Einthoven et al. |
| 2008/0296771 | A1 * | 12/2008 | Das et al. ....................... 257/758 |
| 2010/0237356 | A1 | 9/2010 | Haney et al. |
| 2010/0276779 | A1 | 11/2010 | Guan et al. |
| 2010/0301335 | A1 * | 12/2010 | Ryu et al. ......................... 257/49 |
| 2011/0254010 | A1 * | 10/2011 | Zhang ............................. 257/66 |

FOREIGN PATENT DOCUMENTS

| | | |
|---|---|---|
| CN | 101527324 A | 9/2009 |
| WO | 2006104926 A2 | 10/2006 |

OTHER PUBLICATIONS

Dai et al.; "Leakage Suppression of Low-Voltage Transient Voltage Suppressor", IEEE Transactions on Electron Devices, vol. 55, No. 1, Jan. 2008; pp. 206-210.

* cited by examiner

*Primary Examiner* — Danny Nguyen
(74) *Attorney, Agent, or Firm* — Scott J. Asmus

(57) ABSTRACT

A semiconductor die includes a substrate comprising a first layer of a first wide band gap semiconductor material having a first conductivity, a second layer of a second wide band gap semiconductor material having a second conductivity different from the first conductivity, in electrical contact with the first layer, a third layer of a third wide band gap semiconductor material having a third conductivity different from the first conductivity and second conductivity, in electrical contact with the second layer, a fourth layer of a fourth wide band gap semiconductor material having the second conductivity, in electrical contact with the third layer, and a fifth layer of a fifth wide band gap semiconductor material having the first conductivity and in electrical contact with the fourth layer, wherein the first layer, the second layer, the third layer, the fourth layer, and the fifth layer are sequentially arranged to form a structure.

29 Claims, 11 Drawing Sheets

VARIABLE BREAKDOWN TRANSIENT VOLTAGE SUPPRESSOR

BACKGROUND

The present application relates generally to transient voltage suppression devices or surge protection devices for protecting electronic circuitry.

A transient voltage suppressor (TVS) device, more popularly known as a surge protector, is an electronic component that is utilized for protecting sensitive electronics from damage such as voltage spikes. A transient or excess voltage (or current) is a momentary or fleeting surge in the voltage (or current) that may harm the sensitive electronic circuitry. In general, a transient voltage suppressor device operates on two principles: attenuating excess current or transient current thereby limiting residual current, or diverting a transient or an excess current from the sensitive electronic components.

Attenuating a transient current is typically achieved by ensuring that the transient current does not reach or impact the sensitive electronic components, often by using filters inserted in series with the electronic components. Diverting a transient current is typically achieved by using a voltage clamping device or a crowbar type device. In operation, the voltage clamping device has variable impedance that varies in response to the current flowing through the voltage clamping device.

Silicon based TVS devices have conventionally been used for preventing sensitive electronic components from being subjected to current or voltage transients caused by lightning strikes or electromagnetic interferences. However, silicon based TVS devices are more vulnerable to generate high leakage currents as the temperatures are increased. Particularly, when the ambient temperature reaches unacceptably high values, for example 225 degrees Celsius, the silicon based TVS devices become unsuitable for the operation due to the excessive leakage current. For example, the silicon based TVS devices are typically incapable of providing sufficient protection to the electronic components used in a distributed control system in an aircraft especially from the voltage surges due to lightning strikes.

Thus, there is an increasing need for TVS devices that can operate in high temperatures, with minimum leakage current and maximum efficiency.

BRIEF DESCRIPTION

In accordance with aspects of the present disclosure, a semiconductor die for a transient voltage suppressor is disclosed. The semiconductor die includes a substrate comprising a first layer of a first wide band gap semiconductor material having a first conductivity, a second layer of a second wide band gap semiconductor material having a second conductivity different from the first conductivity, in electrical contact with the first layer, a third layer of a third wide band gap semiconductor material having a third conductivity different from the first conductivity and second conductivity, in electrical contact with the second layer, a fourth layer of a fourth wide band gap semiconductor material having the second conductivity, in electrical contact with the third layer, and a fifth layer of a fifth wide band gap semiconductor material having the first conductivity, in electrical contact with the fourth layer, wherein the first layer, the second layer, the third layer, the fourth layer, and the fifth layer are sequentially arranged to form a structure.

In accordance with another aspect of the present disclosure, a method for suppressing a transient voltage is disclosed. The method includes detecting an applied voltage greater than a threshold voltage across a semiconductor die, wherein the semiconductor die includes a first layer of a first conductivity, a second layer of a second conductivity, a third layer of a third conductivity, a fourth layer of the second conductivity, and a fifth layer of the first conductivity. The method further includes detecting a reverse breakdown voltage across the first layer and the second layer in response to detecting the applied voltage, generating a first plurality of charge carriers at a junction between the first layer and the second in response to detecting the reverse breakdown voltage, moving a first set of charge carriers among the first plurality of charge carriers towards the fifth layer, detecting a forward bias voltage across the fourth layer and the fifth layer, moving a second set of charge carriers from the fifth layer towards the first layer in response to detecting the forward bias, and absorbing the first set of charge carriers and the second set of charge carriers in at least one of the first layer, the second layer, the third layer, the fourth layer, and the fifth layer; wherein the first layer, the second layer, the third layer, the fourth layer, and the fifth layer are disposed sequentially to form a structure.

In accordance with yet another aspect of the present disclosure, a method for forming a transient voltage suppressor is disclosed. The method includes providing a substrate comprising a first wide band gap semiconductor material, diffusing a dopant of a first conductivity type into the substrate to obtain a first layer of a first conductivity, forming a second layer of a second wide band gap semiconductor material having a second conductivity over at least a portion of the first layer, forming a third layer of a third wide band gap semiconductor material having a third conductivity over at least a portion of the second layer, forming a fourth layer of a fourth wide band gap semiconductor material having the second conductivity over at least a portion of the third layer, and forming a fifth layer of a fifth wide band gap semiconductor material having the first conductivity over at least a portion of the fourth layer.

In accordance with yet another aspect of the present disclosure, an electronic system is disclosed. The electronic system includes at least one electronic unit and a protection device electrically coupled to the at least one electronic unit. The protective device includes a semiconductor die having a structure. The semiconductor die includes a substrate comprising a first layer of a first wide band gap semiconductor material having a first conductivity, a second layer of a second wide band gap semiconductor material having a second conductivity different from the first conductivity, in electrical contact with the first layer, a third layer of a third wide band gap semiconductor material having a third conductivity different from the first conductivity and the second conductivity, in electrical contact with the second layer, a fourth layer of a fourth wide band gap semiconductor material having the second conductivity in electrical contact with the third layer, and a fifth layer of a fifth wide band gap semiconductor material having the first conductivity in electrical contact with the fourth layer, wherein a first terminal of the protection device is electrically coupled to the substrate and a second terminal of the protection device is electrically coupled to the fifth layer.

DRAWINGS

These and other features and aspects of embodiments of the present system and techniques will become better understood when the following detailed description is read with reference to the accompanying drawings in which like characters represent like parts throughout the drawings, wherein.

Figures 3, 4:
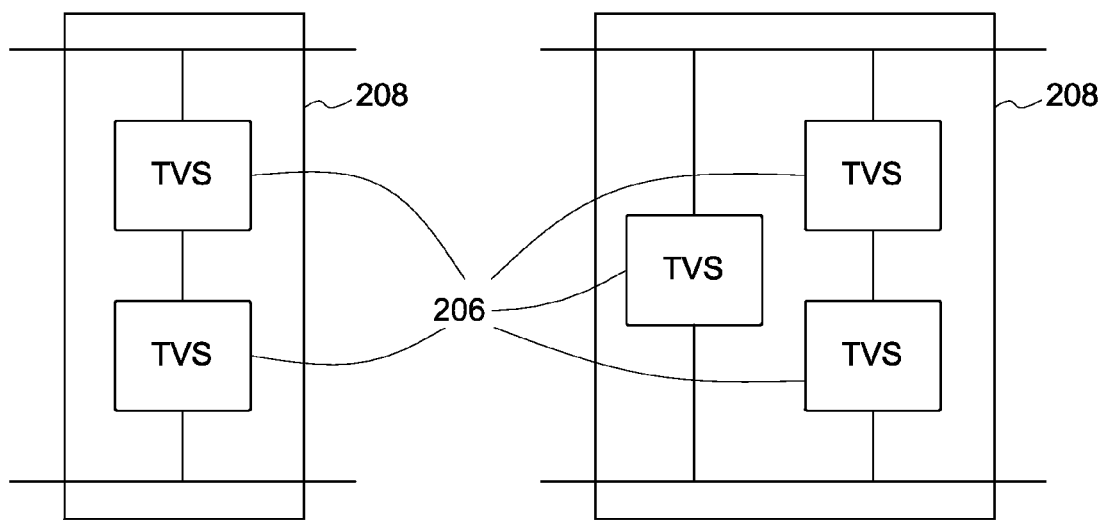
Figure 5:
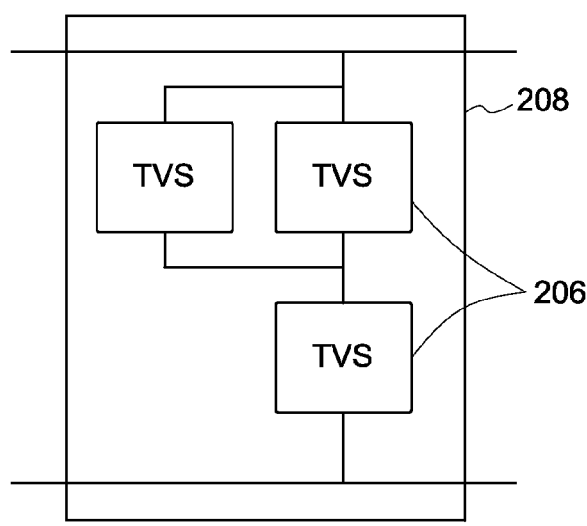
Figure 6:
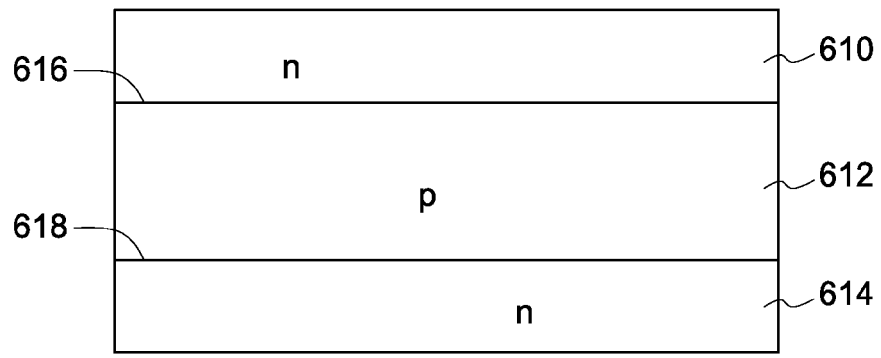
Figure 7:
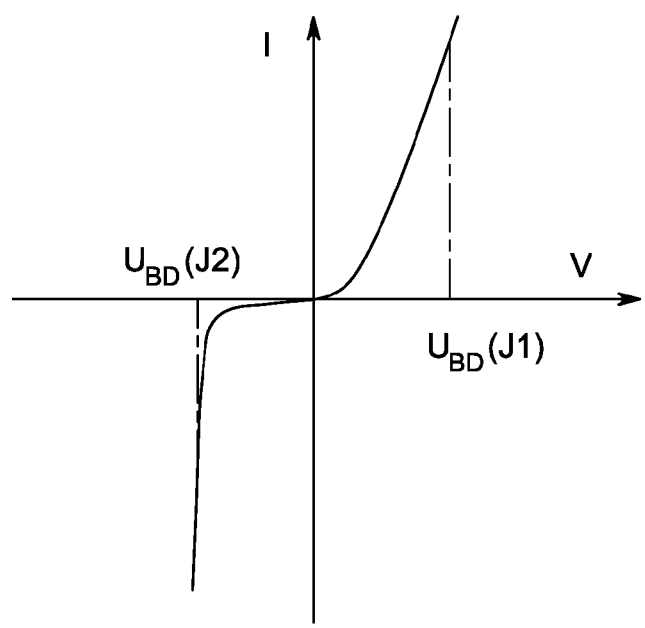
Figure 8:
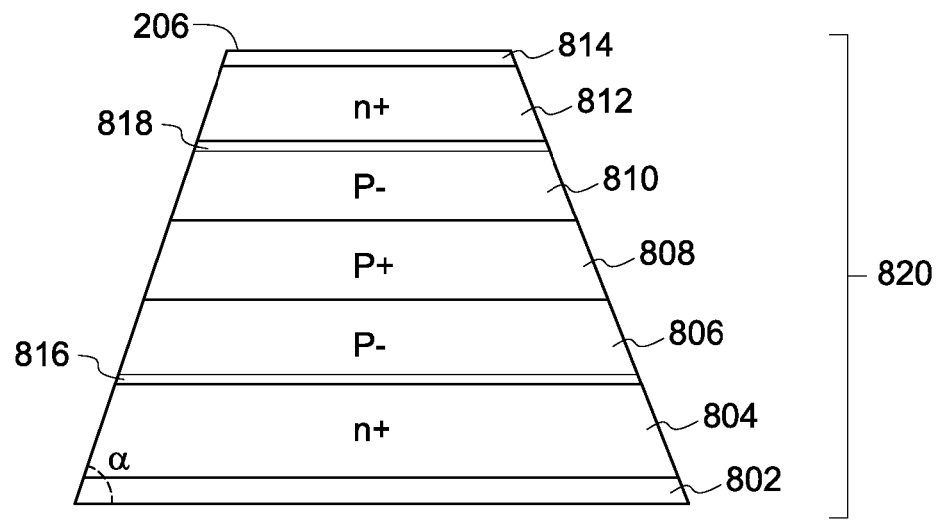
Figure 9:
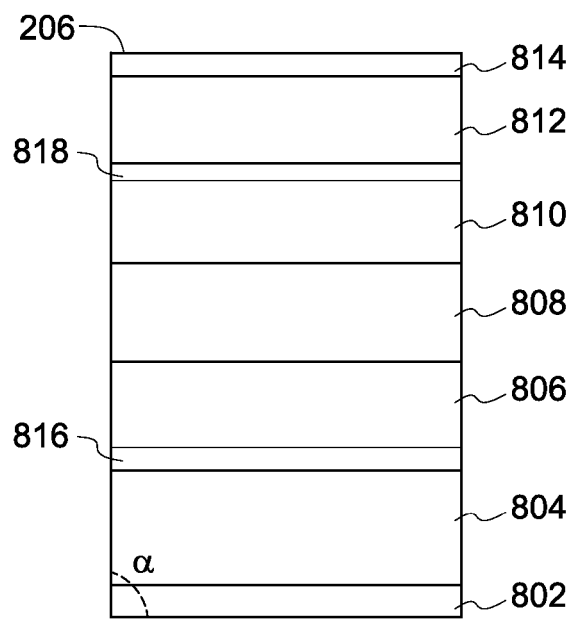
Figure 10:
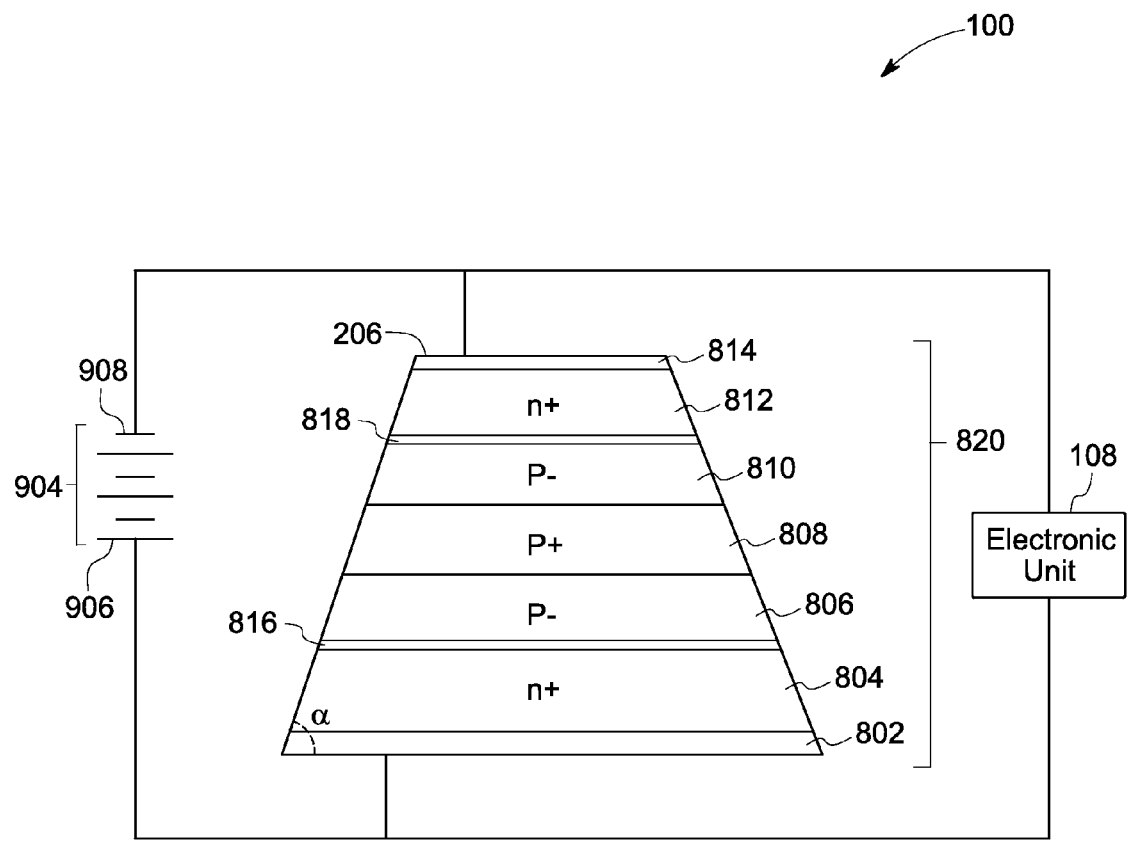
Figure 11:
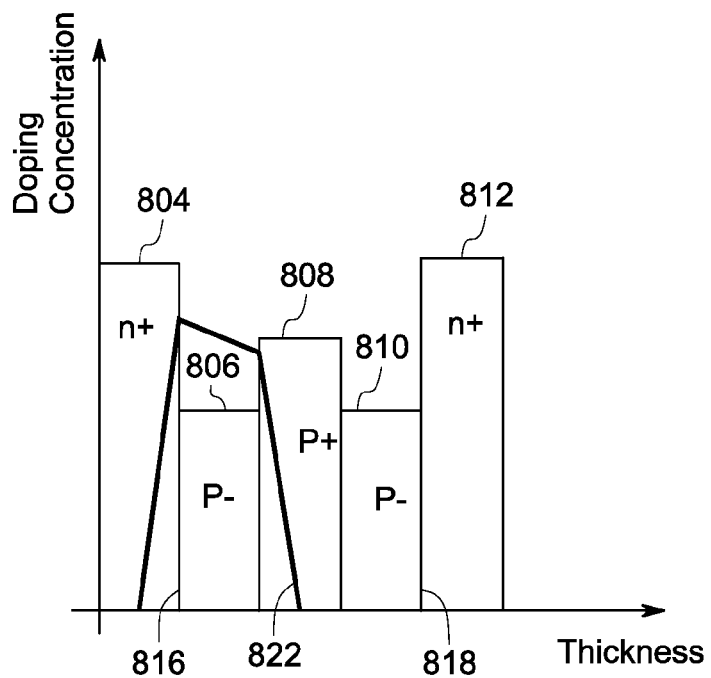
Figure 12:
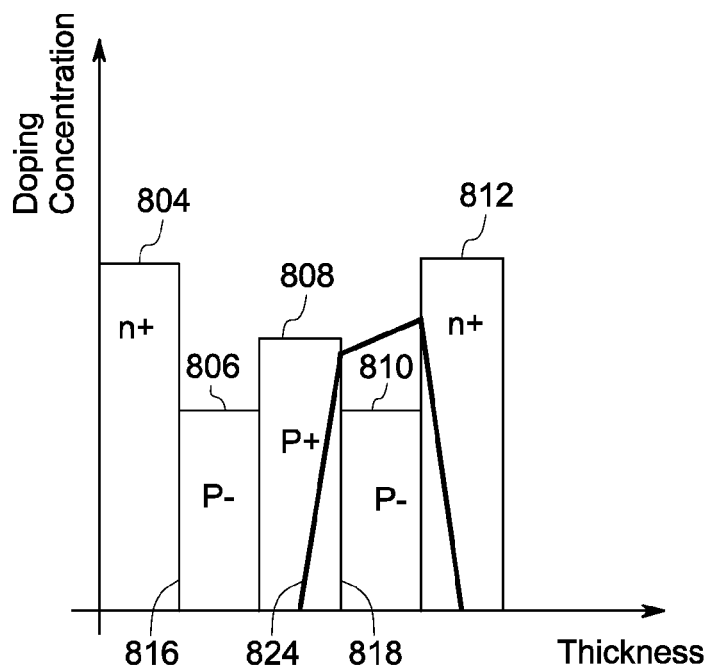
Figure 13:
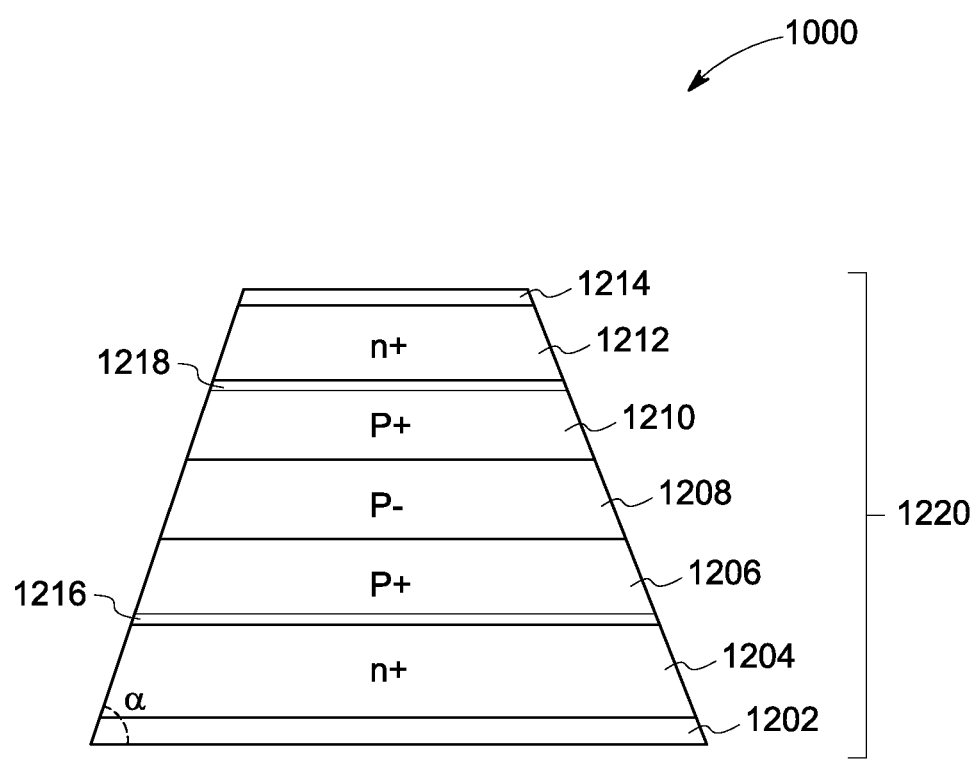
Figure 14:
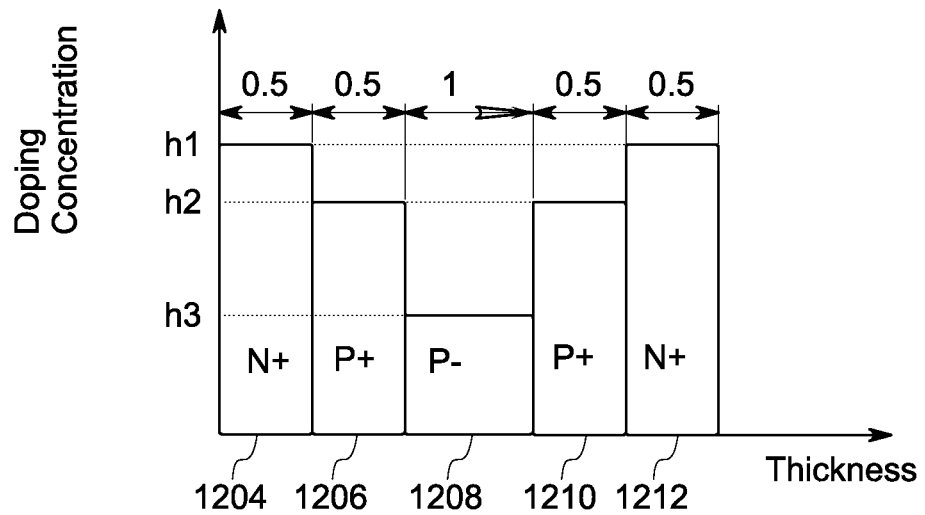
Figure 15:
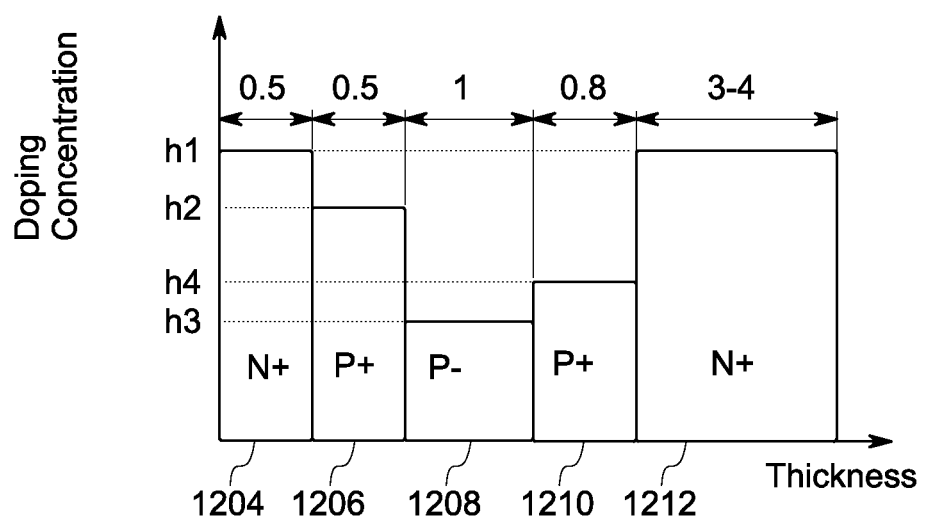
Figure 16:
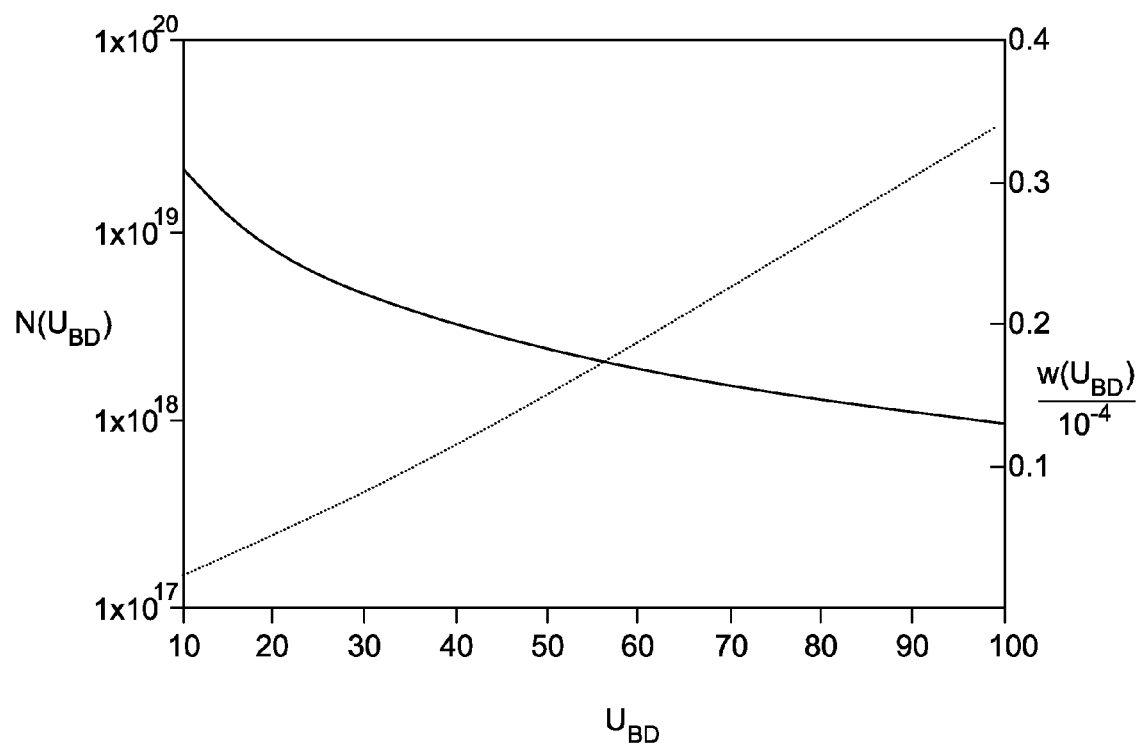
Figure 17:
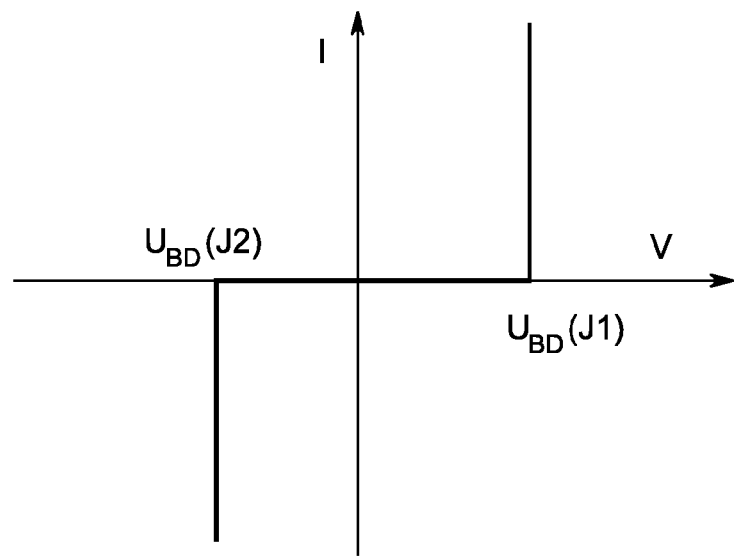
Figure 18:
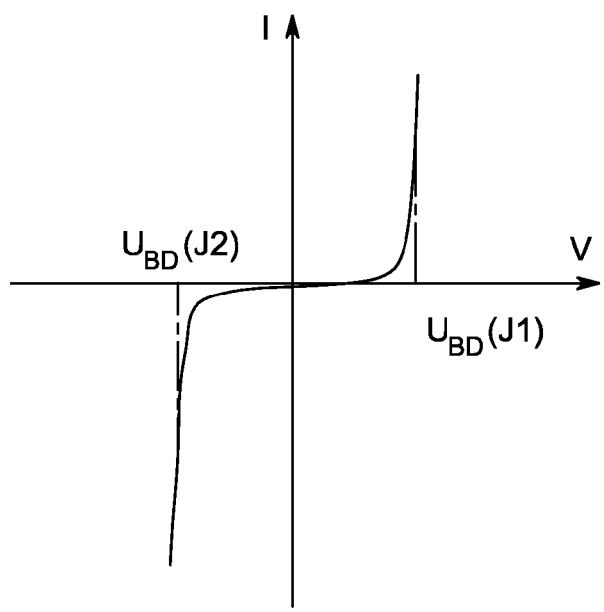
Figure 19:
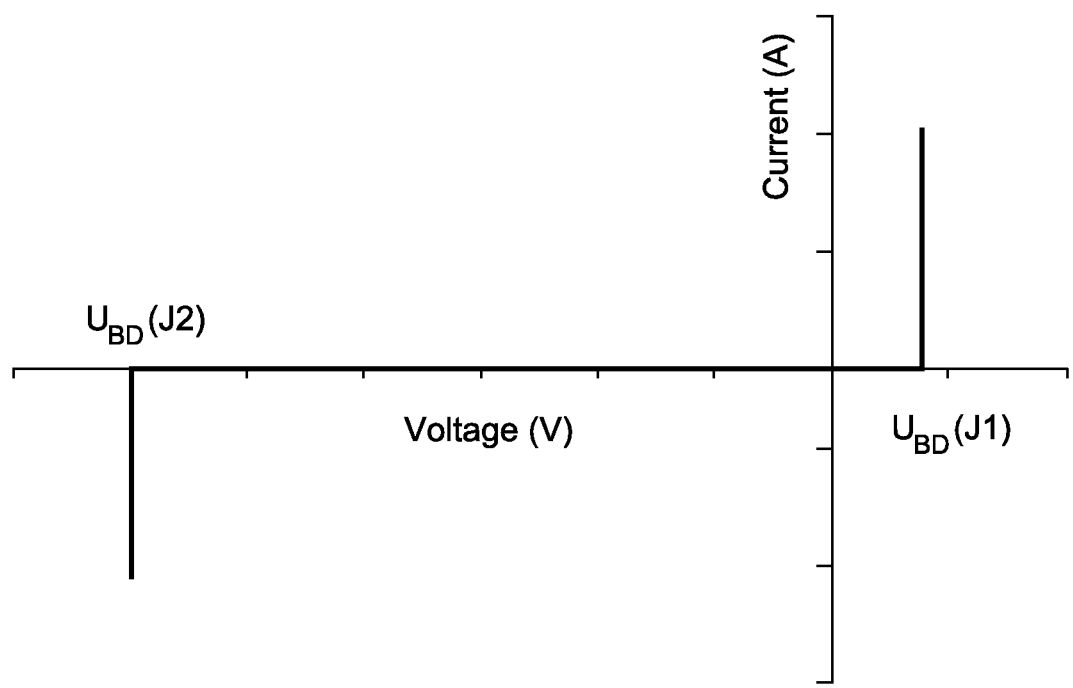

FIGS. 3, 4, and 5 represent various configurations of the transient voltage suppressor (TVS) in accordance with other embodiments;

FIG. 6 is a block diagram of a conventional transient voltage suppressor (TVS);

FIG. 7 is a graph illustrating a current versus voltage relationship for a conventional transient voltage suppressor (TVS) shown in FIG. 6;

FIG. 8 is a schematic representation of a transient voltage suppressor (TVS) in accordance with an exemplary embodiment;

FIG. 9 is another schematic representation of a transient voltage suppressor (TVS) in accordance with another exemplary embodiment;

FIG. 10 is a schematic representation of a transient voltage suppressor (TVS) in operation in accordance with an exemplary embodiment;

FIG. 11 is a graphical representation of an electric field distribution in the transient voltage suppressor of FIG. 8 according to one embodiment;

FIG. 12 is a graphical representation of an electric field distribution in the transient voltage suppressor of FIG. 8 according to another embodiment;

FIG. 13 is a schematic representation of a transient voltage suppressor (TVS) in accordance with an exemplary embodiment;

FIG. 14 represents a graph representing variation of a doping concentration versus layer thickness for a symmetrical transient voltage suppressor according to one embodiment;

FIG. 15 represents a graph representing variation of a doping concentration versus layer thickness for an asymmetrical transient voltage suppressor according to one embodiment;

FIG. 16 shows a graph representing variation of a doping concentration versus break down voltage, and width of junction for a transient voltage suppressor shown in FIG. 10 in accordance with an embodiment;

FIG. 17 is a graph representing a current versus voltage relationship for a transient voltage suppressor (TVS) in accordance with an embodiment;

FIG. 18 is a graph representing a current versus voltage relationship for a symmetrical transient voltage suppressor (TVS) according to an embodiment; and FIG. 19 is a graph representing a current versus voltage relationship for an asymmetrical transient voltage suppressor (TVS) according to an embodiment.

DESCRIPTION

Embodiments disclosed herein are generally directed towards protection of electronic units in a system. According to one embodiment, the disclosure describes a transient voltage protection device or a surge protector that may be used in combination with sensitive electronic units to protect the electronic units from voltage surges, or current surges, or transient currents or transient voltages in the system. In one example, the transient voltage protection is provided at substantially high temperatures, for example, temperatures greater than 200 degrees Celsius, and in other examples for temperatures at or above 300 degrees Celsius. Hereinafter, the terms "voltage surge" and "transient voltage" may be used interchangeably to indicate an unexpected or excessive increase in voltage compared to an average voltage across the system. Similarly, the terms "current surge" and "transient current" may be used interchangeably to indicate an unexpected increase in the current compared to an average current transmitted through the system. Hereinafter, the term "transients" may be used to generically refer to transient voltage or transient current. Although certain embodiments of the present invention are discussed herein with reference to systems operating at high temperatures, it should be noted herein that the application of embodiments of the present system may also be suitable for other systems that require protection from voltage or current surges. This includes but not limited to various power distribution systems that require installing expensive cooling systems or moving the electronic units in the power distribution system away from the sensors or actuators to prevent any damage due to excessive voltage or voltage surges.

Figure 1:
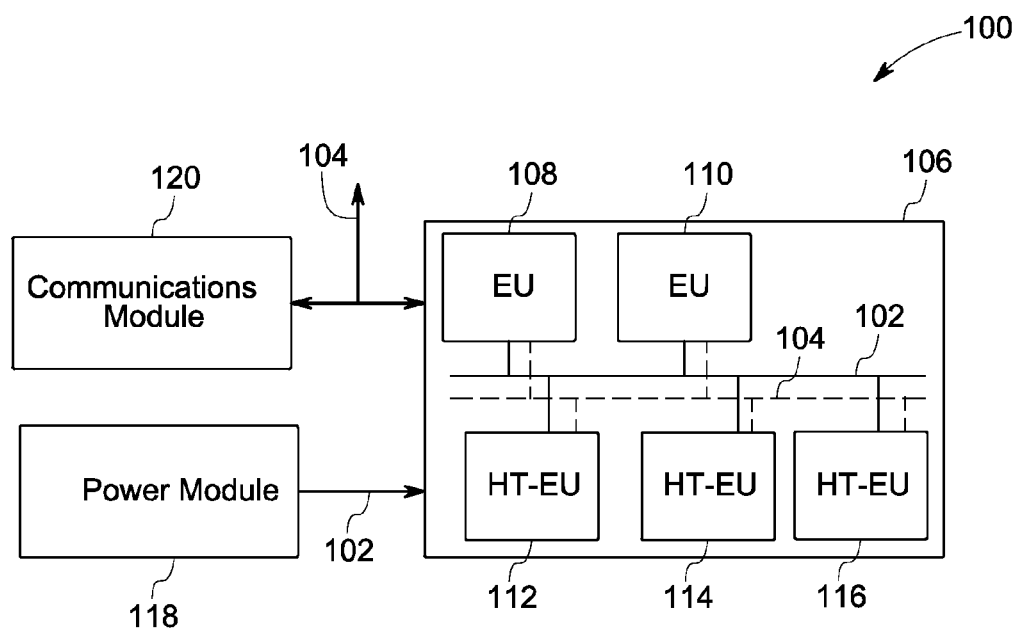
FIG. 1 is an exemplary system including electronic units that require protection from voltage surges from a power module in accordance with an exemplary embodiment.

FIG. 1 is a simplified block diagram of a system 100 in accordance with an exemplary embodiment of the present system. In an exemplary embodiment, the system 100 may include but is not limited to an aircraft or probes sent deep into bore wells used for exploration and monitoring of petroleum and geothermal wells. In certain applications this may be in environments where temperatures may reach as high as 200 to 300 degrees Celsius or even greater. In one example, the system 100 includes a power supply bus 102, a communication channel 104, and a plurality of electronic units located within the component 106 of the system 100. In an exemplary embodiment, the component 106 may be a gas turbine engine including a fan and/or a core engine of an aircraft. In another embodiment, the component 106 may be one of a piston driven internal combustion engine, a compressor, a generator, and a pump. Further, the plurality of electronic units may include electronic units (EU) 108, 110 operated at normal ambient temperatures, and electronic units capable of operating at temperatures as high as 200 degrees Celsius, 300 degrees Celsius, and greater than 300 degrees Celsius, herein referred to as "high temperature electronic units" (HT-EU) 112, 114, 116. It should be understood that the electronic units 108, 110 and high temperature electronic units 112, 114, 116 can be disposed as a co-located unit that could include disposing the electronic units away from the higher temperature regions or with some insulation to protect the electronic units. In other applications the electronic units 108, 110 are physically located away from the high temperature electronic units 112, 114, 116 and the high temperature regions.

The system 100 further includes a power module 118 for providing power to the component 106. The component 106 may further transmit the received power to the electronic units 108, 110 and high temperature electronic units 112, 114, 116 via the power supply bus 102. Similarly, communication among various electronic units 108, 110 and high temperature electronic units 112, 114, 116 are transmitted via the communication channel 104. In one example the communication channel 104 is further coupled to a communication module 120 that transmits, processes, and receives all communication to and from the component 106 of the system 100. It should be noted herein that in other embodiments, configuration of the system 100 may vary depending on the application. For example, the communication module 120 and/or power module 118 can be co-located or integrated within the component 106 as well as positioned apart from the component 106 and operatively coupled by wiring. In another example, the communication module 120 is decentralized and integrated into the electronic units 108, 110 and high temperature electronic units 112, 114, 116 such as employing transceivers that communicate to a central processing system (not shown).

During an operation of the system 100 according to one embodiment, when an electromagnetic interference or lightning impacts the system 100, transient voltage spikes are typically induced onto the power module 118 that is coupled to the power supply bus 102. The transient voltages may therefore damage the electronic units 108, 110 and high temperature electronic units 112, 114, 116. In order to prevent such damage, an exemplary protection devices (not shown) such as one or more transient voltage suppressors or surge protectors are coupled to the electronic units 108, 110, and the high temperature electronic units 112, 114, 116. The protection device such as the transient voltage suppressor may be disposed in parallel or in series with the electronic units 108, 110 and high temperature electronic units 112, 114, 116. It should be noted herein that the configuration illustrated in FIG. 1 is an exemplary embodiment and should not in any way be construed as limiting the scope. The arrangement of the various components, number of components, integration of components, and relative positions may vary depending on the application. The protection device is explained in greater detail below with reference to subsequent figures.

Figure 2:
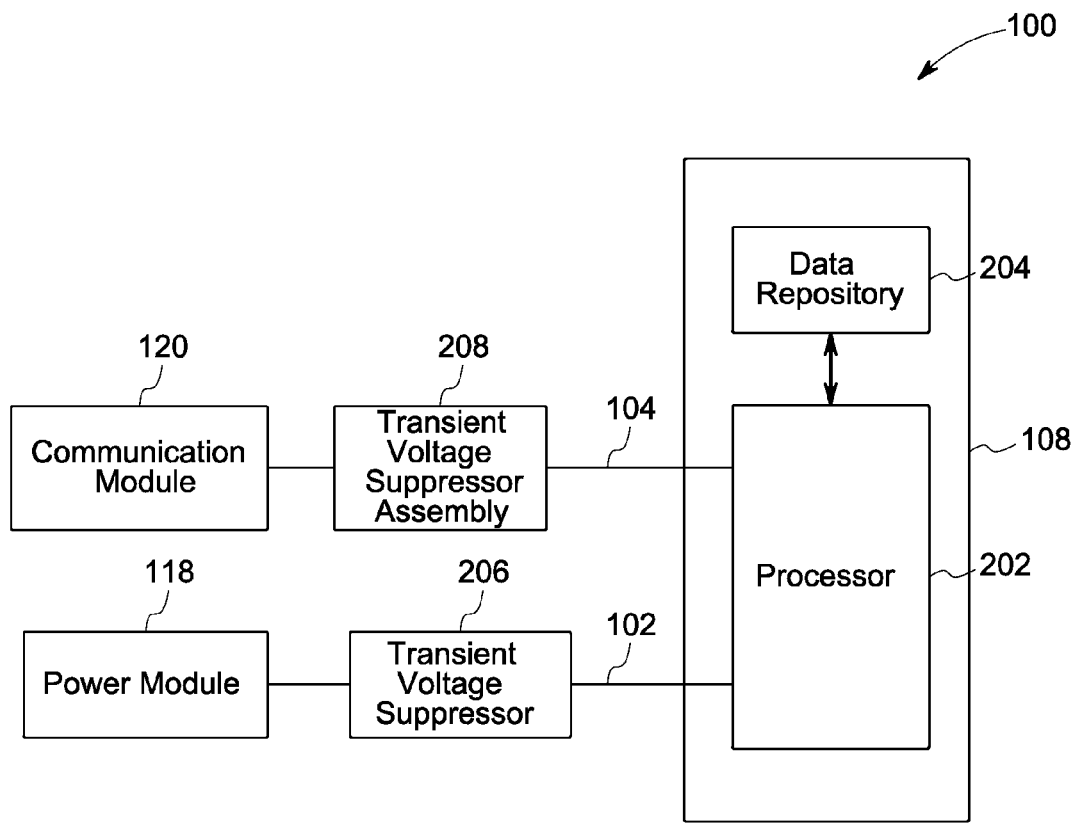
FIG. 2 is a block diagram of an exemplary electronic unit of the system of FIG. 1 coupled with one or more protection devices in accordance with an embodiment.

FIG. 2 is an exemplary schematic block diagram representing the electronic unit 108, the power module 118, the communication module 120, a transient voltage suppressor 206, and a transient voltage suppressor assembly 208 according to an exemplary embodiment. The illustrated electronic unit 108 in this example further includes but not limited to a processor 202 and a data repository 204. The processor 202 is an electronic circuit capable of processing instructions and performing various tasks such as computations etc. The processor 202 in one aspect is one or more processors, controllers, microcontrollers and the like. The data repository 204, such as a memory storage unit including random access memory, read only memory, flash memory, or the like is used for storage of various types of information associated with the electronic unit 108. The power module 118 is coupled to a voltage supply source (not shown) and is configured to distributed power through the electronic unit 108. In an exemplary embodiment, the power module 118 is coupled to the power supply bus 102 and distributes power through the electronic unit 108. Further, in one embodiment, the communications module 120 is coupled to the communications channel 104. The communication module 120 and the power module 118 of the electronic unit 108 are at risk of being damaged due to any transients resulting from lightning strikes, solar flares, electromagnetic pulse (EMP), or other electromagnetic interferences in the system 100, since the communication module 120 and the power module 118 are coupled to the communication channel 104 and power supply bus 102 respectively. In accordance with the embodiments of the present system, in order to prevent transients from being transmitted to the electronic unit 108 via the communication module 120 and/or the power module 118 via the bus 102, and the channel 104, one or more transient voltage suppressors (TVS) 206 or an assembly of transient voltage suppressors 208 are coupled to the communication channel 104 and the power supply bus 102 respectively. It should be noted herein that although the exemplary voltage suppressor are discussed specifically with reference to the electronic unit 108, in other embodiments, the voltage suppressor 206 may be used for other electronic units including the high temperature electronics units. The TVS 206 is further explained in greater detail with reference to the subsequent figures. The TVS assembly 208 in one example refers to a plurality of TVS devices 206. For example, the TVS assembly 208 may include one or more of a series arrangement of TVS 206 or one or more of a parallel arrangement of TVS 206 or combinations thereof. It should be noted herein that the configuration illustrated in FIG. 2 is an exemplary embodiment and should not in any way be construed as limiting the scope. The arrangement of the various components, number of components, integration of components, and relative positions may vary depending on the application. Specifically, the number and relative positions of TVS may vary depending on the application.

FIGS. 3, 4, 5 illustrate schematic block diagrams of various configurations in which one or more transient voltage suppressor (TVS) can be coupled to form an assembly 208 that may be coupled to an electronic unit, such as the electronic unit 108 of FIG. 1, for preventing damage to the electronic unit 108. In an exemplary embodiment illustrated in FIG. 3, the transient voltage suppressor assembly 208 includes two TVS 206 coupled in series. Similarly, in the exemplary embodiment illustrated in FIG. 4, a transient voltage suppressor assembly 208 includes two transient voltage suppressors 206 coupled in series combination, while a third transient voltage suppressor 206 is coupled in parallel across the series combination. Similarly, in the exemplary embodiment illustrated in FIG. 5, a transient voltage suppressor assembly 208 includes two transient voltage suppressors 206 in a parallel configuration disposed in series with a third transient voltage suppressor 206. The transient voltage suppressor assembly 208 shown in FIG. 3, FIG. 4, and FIG. 5 may be placed in parallel with an electronic unit (such as electronic unit 108) under protection. Various other combinations of individual transient voltage suppressors 206 maybe envisaged to provide sufficient current transmitting capacity and voltage performance for different applications.

FIG. 6 is a schematic block diagram of a conventional transient voltage suppressor 600. As shown in FIG. 6, the conventional transient voltage suppressor 600 includes a first semiconductor layer 610, a second semiconductor layer 612, and a third semiconductor layer 614 and two junctions 616, 618 among the layers 610, 612, 614. The semiconductor layers 610, 612, 614 may include any semiconductor material such as silicon. Further, each of the semiconductor layers 610, 612, 614 possesses a specific conductivity. It should be noted herein that the conductivity of a semiconductor material is indicative of the majority and minority charge carriers in the semiconductor material. For example, an n-type semiconductor material includes "negative charge carriers" as majority charge carriers and "positive charge carriers" as minority charge carriers. For example, a p-type semiconductor material includes "negative charge carriers" as minority charge carriers and "positive charge carriers" as majority charge carriers. As is understood by one of ordinary skilled in the art, a "negative charge carrier" refers to electrons whereas a "positive charge carriers" refers to holes. FIG. 6 shows a first layer 610 having a conductivity of type n, a second layer 612 having a conductivity of type p, and a third layer 614 having a conductivity of type n.

FIG. 7 shows a graphical representation of current (I) versus voltage (V) for the conventional transient voltage suppressor 600 shown in FIG. 6. The graph shown in FIG. 7 shows a voltage (V) applied across the conventional transient voltage suppressor 600, represented by the x-axis and the current (I) conducted through the conventional transient voltage suppressor 600, represented by the y-axis. Further, a reverse breakdown voltage is shown to occur at a voltage $U_{BD}$ at a reverse biased junction J2, where J2 may be one of the junctions 616, 618 (shown in FIG. 6). Similarly, a forward biased voltage is shown to occur at a voltage $U_{BD}$ at a junction J1, where J1 is the other of the junctions 616, 618 (i. e. the junction other than a reversed biased junction). The conventional transient voltage suppressor 600 conducts current when one of the junctions 616, 618 is reverse biased while the other junction 616, 618 is forward biased in response to detecting a voltage supply that is greater than a threshold value. A reverse bias is described as a condition where a cathode end (herein, n type layers 610, 614) is coupled to a positive bias of the voltage supply source, whereas an anode end (herein, p type layer 612) is coupled to a negative bias of the voltage supply source. Further, a forward bias is described as a condition when a cathode end (herein n type layers 610, 612) is coupled to a negative bias of the voltage supply source, whereas an anode end (herein p type layer 612) is coupled to a positive bias of the voltage supply source. However, in the conventional transient voltage suppressor 600, a peak electric field is experienced at the edges of the transient voltage suppressor 600 due to a field crowding effect. As known in the art, an electric field at the edges usually becomes larger than in the middle of the transient voltage suppressor 600 (termed as the "field crowding effect"), leading to a reduction of the breakdown voltage. Even if the edges of the conventional transient voltage suppressor 600 are beveled, under reverse bias conditions for a junction, the depletion of p-layer (such as layers 610, 614) would occur primarily along the edges (or the side walls) leading to an increase in the leakage current. As a result, soft breakdown characteristic as shown in FIG. 7 occurs at voltage $U_{BD}$ (shows us $U_{BD}$ (J1) and $U_{BD}$ (J2)), leading to a decrease in the reverse breakdown voltage.

FIG. 8 shows a cross sectional view of the transient voltage suppressor (TVS) 206, in accordance with an embodiment. The TVS 206 of FIG. 8 includes a semiconductor die 820 which further includes a first layer 804, a second layer 806, a third layer 808, a fourth layer 810, and a fifth layer 812 and two metal contacts layers 802, 814. The TVS 206 may further include a substrate material (not shown) on which the first layer 804 is formed. In other words, the substrate material is a foundation layer or material on which the first layer 804, the second layer 806, the third layer 808, the fourth layer 810, and the fifth layer 812 are sequentially disposed to form a structure. In one embodiment, the first layer 804, the second layer 806, the third layer 808, the fourth layer 810, and the fifth layer 812 are disposed to form a mesa structure with beveled walls inclined at an angle α with respect to an interface between adjacent layers among the first layer 804, the second layer 806, the third layer 808, the fourth layer 810, and the fifth layer 812. In this case, the angle α ranges from about 2 degrees to less than 90 degrees. For example, in one particular example, the angle α is about 20 degrees. In another embodiment, the first layer 804, the second layer 806, the third layer 808, the fourth layer 810, and the fifth layer 812 are disposed to form a structure with walls inclined at an angle of about 90 degrees with respect to an interface between adjacent layers among the first layer 804, the second layer 806, the third layer 808, the fourth layer 810, and the fifth layer 812, as shown in FIG. 9 where angle α is equal to 90 degrees. In yet another embodiment, two or more layers among the layers 804, 806, 808, 810, 812 may be inclined at different angles with respect to an interface between adjacent layers among the first layer 804, the second layer 806, the third layer 808, the fourth layer 810, and the fifth layer 812.

Returning again to FIG. 8, the metal contact layers 802 and 814 are formed on the opposing ends of the semiconductor die 820 in order to provide ohmic contacts for the first layer 804 and the fifth layer 812. The first layer 804 may be coupled to a metal electrode (not shown) via the metal contact layer 802. Similarly, the fifth layer 812 may be coupled to a metal electrode (not shown) via the metal contact layer 814.

The semiconductor die 820 of the TVS 206 in one example is a block of a semiconducting material on which a functional circuit is fabricated. Further, each of the first layer 804, the second layer 806, the third layer 808, the fourth layer 810, and the fifth layer 812 is constituted of a semiconductor material having an associated conductivity according to one embodiment. In one embodiment, the substrate of the semiconductor die 820 as well as the layers 804, 806, 808, 810, 812 are constituted of a semiconductor material such as a wide band gap semiconductor material. In general, a wide band gap semiconductor is a semiconductor material with electronic band gaps larger than one or two electronvolts (eV). For example, some of the high band gap materials may include diamond, silicon carbide, aluminum nitride, gallium nitride, boron nitride etc. In one exemplary embodiment, the first layer 804 is of a first wide band semiconductor material, the second layer 806 is of a second wide band semiconductor material, the third layer 808 is of a third wide band semiconductor material, the fourth layer 810 is of a fourth wide band semiconductor material, and the fifth layer 812 is of a fifth wide band semiconductor material. In one such embodiment, each of the first wide band gap semiconductor material, the second wide band gap semiconductor material, the third wide band gap semiconductor material, the fourth wide band gap semiconductor material, and the fifth wide band gap semiconductor material is a distinct material. In one exemplary embodiment, the first wide band gap semiconductor material, the second wide band gap semiconductor material, the third wide band gap semiconductor material, the fourth wide band gap semiconductor material, and the fifth wide band gap semiconductor material have some materials that are similar and some materials that are different. In yet another exemplary embodiment, the first wide band gap semiconductor material, the second wide band gap semiconductor material, the third wide band gap semiconductor material, the fourth wide band gap semiconductor material, and the fifth wide band gap semiconductor material are the same materials. In one specific exemplary embodiment, each of the first wide band gap semiconductor material, the second wide band gap semiconductor material, the third wide band gap semiconductor material, the fourth wide band gap semiconductor material, and the fifth wide band gap semiconductor material includes silicon carbide (SiC).

Further, the conductivity of the layers 804, 806, 808, 810, 812 is a function of the type of semiconductor material of the layers 804, 806, 808, 810, 812 and a concentration of dopants in the respective semiconductor material in each of the layers 804, 806, 808, 810, 812. According to the exemplary embodiment illustrated in FIG. 8, the first layer 804 and the fifth layer 812 have a conductivity of $n^+$ (n plus) type, the second layer 806 and the fourth layer 810 have a conductivity of $p^-$ (p minus) type, and the third layer 808 has a conductivity of one of a p type or $p^+$ (p plus) type. An n type semiconductor material includes an semiconductor material with a larger concentration of negative charge carriers than positive charge carriers, i.e., an n type semiconductor has a larger electron concentration relative to hole concentration. Therefore, in n type semiconductors, electrons are the majority carriers and holes are the minority carriers. In general, the n type semiconductors are created by doping a semiconductor material with donor impurities. Donor impurities also referred to herein as donor atoms, have more valence electrons than the atoms that the donor atoms replace in the intrinsic semiconductor material during doping. In this way, the donor atoms provide excess electrons to the semiconductor material. Excess electrons increase the negative carrier concentration or electron concentration of the semiconductor material resulting in an n type semiconductor material. For example, an n type semiconductor may be obtained by doping an intrinsic semiconductor material such as a group IV element, for example, silicon (Si) with a group V element such as phosphorous (P), arsenic (As) etc.

Similarly, a p type semiconductor material includes a larger concentration of positive charge carriers, hereon referred to as "holes", than the negative charge carriers. A p type semiconductor material is obtained by doping a semiconductor material with acceptor impurities. Acceptor impurities have less valence electrons than the atoms that the impurities replace in the semiconductor material, thereby providing excess holes and creating a p type semiconductor material. For example, a p type semiconductor may be obtained by doping an extrinsic semiconductor material such as a group IV element, for example, silicon (Si) with a group III element for example, boron (B), aluminum (Al) etc.

Further, a doping concentration of an intrinsic semiconductor material may be relative, generating an $n^+$ or $n^-$ and similarly $p^+$ or $p^-$ semiconductor. The superscripts plus (+) and minus (−) denote the relative level of doping. For example, an $n^+$ type semiconductor material is heavily doped with semiconductor impurities compared to an $n^-$ semiconductor material (or an n type semiconductor material) that is relatively lightly doped. Similarly, a $p^+$ type semiconductor is heavily doped with donor impurities compared to a p type or $p^-$ type semiconductor material. For example, in crystalline intrinsic silicon, there are approximately $5 \times 10^{22}$ atoms/cm$^3$ and the intrinsic charge carrier concentration is approximately 1e10 cm$^{-3}$. Heavily doped silicon includes a proportion of impurity (donor or acceptor) to silicon of the order of 1e18 cm$^{-3}$. On the other hand, lightly doped silicon contains a proportion of impurity (donor or acceptor) to silicon of the order of 1e16 cm$^{-3}$.

Referring again to the illustrated embodiment of FIG. 8, as previously noted, each layer 804, 806, 808, 810, 812 is associated with a wide band gap semiconductor material having an associated conductivity. The first layer 804 of conductivity $n^+$ type may be obtained by a suitable process such as diffusion or epitaxial growth of impurities on a semiconductor substrate. As previously explained, the $n^+$ layer has an excess concentration of negative charge carriers (electrons) as compared to the semiconductor substrate. The excess concentration of negative charge carriers in the first layer 804 may be attributed to the heavy doping of the first layer 804 with donor impurities. In an exemplary embodiment, the first layer 804 is a silicon carbide (SiC) based semiconductor layer. The first layer 804 is disposed between the metal contact layer 802 and the second layer 806.

The second layer 806 has a conductivity of $p^-$ type and is disposed on the first layer 804. The second layer 806 is a lightly doped p layer, i.e., the second layer 806 is lightly doped with acceptor impurities compared to a p type layer. Therefore, the second layer 806 has a relatively lower concentration of positive charge carriers as compared to a concentration of positive charge carriers in a layer of p type. However, in comparison to the first layer 804 which is an $n^+$ type layer, the second layer 806 has a larger concentration of positive charge carriers. The second layer 806 is disposed between the first layer 804 and the third layer 808. In one embodiment, the second layer 806 is disposed epitaxially on the first layer 804. In another embodiment, the second layer 806 is formed on the first layer 804 using an ion implantation technique.

The third layer 808 has a conductivity of either $p^+$ type or p type and is heavily doped with acceptor impurities. The third layer 808 has a higher concentration of positive charge carriers compared to the second layer 806 ($p^-$ type) and the first layer 804 ($n^+$ type). The third layer 808 is disposed between the second layer 806 and the fourth layer 810. The third layer 808 is formed on the second layer 806 by using one or more semiconductor fabrication techniques such as epitaxial growth, ion implantation, or similar fabrication techniques.

The fourth layer 810 has a conductivity of $p^-$ type, i.e., the fourth layer 810 has a lower concentration of positive charge carriers compared to the third layer 808, which is one of a p type or $p^+$ type layer. The fourth layer 810 is relatively lightly doped with acceptor impurities. In one embodiment, the doping concentration of the fourth layer 810 may be similar to the doping concentration of the second layer 806. In another embodiment, the doping concentration of the fourth layer 810 is slightly lower than the doping concentration of the second layer 806, resulting in less positive charge carriers in the fourth layer 810 than in the second layer 806. In yet another embodiment, the doping concentration of the fourth layer 810 is slightly greater than the doping concentration of the second layer 806, resulting in more positive charge carriers in the fourth layer 810 than in the second layer 806. Similar to the earlier discussed layers, the fourth layer 810 is disposed between the third layer 808 and the fifth layer 812.

The fifth layer 812 has a conductivity of $n^+$ type, i.e., the fifth layer 812 is a heavily doped n layer. The fifth layer 812 is heavily doped with donor impurities. In other words, the fifth layer 812 has more negative charge carriers compared to each of the second layer 806, the third layer 808, and the fourth layer 810. However, in comparison to the first layer 804, the fifth layer 812 may be relatively equivalently doped, or relatively lightly doped, or relatively heavily doped, depending upon the application.

It should be noted herein that a breakdown voltage of a junction formed between mutually adjoining layers is determined based on a concentration of dopants in one or more of an adjoining p type ($p^+$ type or $p^-$ type) and n type ($n^+$ type or $n^-$ type) layer and the thickness of the corresponding layer. In the absence of an external applied voltage supply source, an equilibrium condition is obtained across the junction by diffusion of free charge carriers between the adjoining layers across the junction leading to a creation of a "potential barrier" or a "potential difference" or a "depletion region". The breakdown voltage of a junction may be referred to as a maximum voltage that can be applied across the junction (also referred to as "depletion region") before the junction collapses.

In the illustrated exemplary embodiment of FIG. 8, a breakdown voltage across a first junction 816 between the first layer 804 and the second layer 806 is determined based on a concentration of dopants in the first layer 804, and the second layer 806, and a thickness of the first layer 804, and the second layer 806. Similarly, a breakdown voltage for a second junction 818 between the fourth layer 810 and the fifth layer 812 is determined based on a concentration of dopants in the fourth layer 810, and the fifth layer 812, and a thickness of the fourth layer 810, and the fifth layer 812. In one embodiment, the breakdown voltage of the first junction 816 and the breakdown voltage of the second junction 818 may be similar, leading to a symmetrical transient voltage suppressor 208. In another embodiment, the breakdown voltage of the first junction 816 and the breakdown voltage of the second junction 818 may be different leading to an asymmetrical transient voltage suppressor 208.

Further, according to one exemplary embodiment of the present device, a transient voltage suppressor may be a mirror image of the transient voltage suppressor 206 illustrated in FIG. 8. In such an embodiment, the mirror-image transient voltage suppressor constitutes of a first layer of a first wide band semiconductor material having a conductivity of p+ type, a second layer of a second wide band semiconductor material having a conductivity of n− type, a third layer of a third wide band semiconductor material having a conductivity of either an n type or an n+ type, a fourth layer of a fourth wide band semiconductor material having a conductivity of n− type, and a fifth layer of a fifth wide band semiconductor having a conductivity of p+ type. The working of the transient voltage suppressor 206 is explained in greater detail with reference to subsequent figures. The mirror-image transient voltage suppressor operates in a similar fashion as the transient voltage suppressor 206 using its minority and majority charge carriers in various layers.

FIG. 10 is an exemplary representation of an electronic system 100 having a symmetrical transient voltage suppressor 206 coupled to the electronic unit 108 and the voltage supply source 904. The transient voltage suppressor 206 having a semiconductor die 820 is configured to protect the electronic unit 108 from voltage transients or voltage spikes. In one embodiment, the transient voltage suppressor 206 may be coupled in parallel with the electronic unit 108. In other embodiments, any suitable orientation may be used for coupling the transient voltage suppressor 206 to the electronic unit 108 to protect the electronic unit 108. The electronic unit 108 may be operated at ambient temperature or at a substantially higher temperature, for example, in the range of 150° C. to 300° C., or greater.

In the illustrated embodiment, the transient voltage suppressor 206 has a symmetrical semiconductor die 820 with a same reverse breakdown voltage for both the junctions 816, 818. In other words, a reverse breakdown voltage for the first junction 816 between the first layer 804 and the second layer 806 is the same as the reverse breakdown voltage for the second junction 818 between the fourth layer 810 and the fifth layer 812. That is, a concentration of dopants and a thickness of the second layer 806 is equivalent to a concentration of dopants and a thickness of fourth layer 810 to achieve a symmetrical semiconductor die 820. Further, the voltage supply source 904 is coupled across the semiconductor die 820 such that a positive terminal (bias) 906 of the voltage supply source 904 is coupled to one end of the transient voltage suppressor 206 and a negative terminal (bias) 908 is coupled to an opposite end of the transient voltage suppressor 206. In the illustrated exemplary embodiment, the positive terminal 906 is coupled via the metal layer 802 to the first layer 804 of the transient voltage suppressor 208. The negative terminal 908 is coupled via the metal layer 814 to the fifth layer 812 of the transient voltage suppressor 206.

In response to applying the voltage supply source 904 in the above described manner, the transient voltage suppressor 206 determines an electric potential difference between the first layer 804 and the fifth layer 812, i.e., across the semiconductor die 820. When the electric potential difference across the first layer 804 and the fifth layer 812 is greater than a threshold value, such as in case of an occurrence of a voltage transient, the semiconductor die 820 starts to conduct electric current. In particular, the voltage thus created causes the semiconductor die 820 to be more conducting compared to the electronic unit 108 by providing a lower resistance path to the flow of current. Thus, when a voltage spike or transient is encountered, the excess current is borne by the transient voltage suppressor 206 while protecting the electronic unit 108. It should be noted herein that the voltage threshold value is a function of the concentration of dopants in the mutually adjacent layers and thickness of the corresponding mutually adjacent layers. A detailed explanation for the working of the transient voltage suppressor 206 in response to experiencing a voltage transient is described in further detail herein.

Under certain transient conditions, a high voltage of the order of 1500 or more volts from the voltage supply source 904 is generated between the first layer 804 and the fifth layer 812. When the generated voltage is higher than a threshold voltage, a reverse biasing of the first layer 804 and the second layer 806 occurs. The threshold voltage supply is a function of the semiconductor material of the layers 804, 806, 808, 810, 812 and a doping concentration of each of the layers 804, 806, 808, 810, 812. It should be noted herein that a reverse bias is a condition when a cathode end (n type semiconductor) is coupled to a positive bias (such as positive bias 906), whereas an anode end (p type semiconductor) is coupled to a negative bias (such as negative bias 908) of the voltage supply source 904. With an increase in the electric potential difference across the transient voltage suppressor 206, the reverse biasing across the first layer 804, and the second layer 806 also increases, leading to a generation of a large number of high energy charge carriers at the first junction 816 between the first layer 804 and the second layer 806. These high energy charge carriers knock down other charge carriers from the nearby atoms at the first junction 816. Such multiplication of charge carriers eventually results in an "avalanche breakdown" at the first junction 816 between the first layer 804 and the second layer 806 due to the excess of the charge carriers, resulting in increase of the current flow.

It is to be noted that each of the charge carriers possesses specific charge conductivity. The charge conductivity may be either positive charge conductivity or a negative charge conductivity. In the illustrated embodiment, some of the charge carriers possess a negative charge conductivity and are thereon referred to as negative charge carriers or electrons. Similarly, some of the charge carriers possess positive charge conductivity and are referred to as positive charge carriers or holes.

Further, the negative charge carriers among the generated charge carriers at the first junction 816 due to avalanche breakdown move towards the first layer 804. On the other hand, the positive charge carriers among the charge carriers generated at the first junction 816 move towards the second layer 806. At the same time, the second junction 618 between the fourth layer 810 and the fifth layer 812 experiences a forward bias. A forward bias is a condition when the cathode end (n type semiconductor) is coupled to a negative bias while the anode end (p type semiconductor) is coupled to a positive bias. Under the forward bias condition, negative charge carriers at the second junction 818 are forced to move towards the fourth layer 810.

As a result, eventually, a movement of the negative charge carriers occurs from the fifth layer 812 towards the first layer 804. Simultaneously, the positive charge carriers move from the first layer 804 towards the fifth layer 812. While travelling from the first layer 804 towards the fifth layer 812, some of the positive charge carriers recombine with the charge carriers of opposing charge conductivity, i.e., the negative charge carriers in each of the second layer 806, third layer 808, fourth layer 810, and the fifth layer 812. The remaining positive charge carriers move towards the fifth layer 612 under the influence of the voltage supply source 904.

During the movement of the charge carriers between the first layer 804 and the fifth layer 812, the heavily doped p+ third layer 808 enables reduction in leakage current from the transient voltage suppressor 206. The leakage current is a relatively small electric current that flows through the first junction 816 of the semiconductor die 820, when the first junction 816 experiences reverse biasing. In the absence of a grounding connection, the leakage current could flow from any conductive part or surface of non-conductive parts to ground if a conductive path was available (such as a human body). The heavily doped $p^+$ third layer 808 reduces the leakage current by preventing a plurality of charge carriers from an edge of a depletion region or within the first junction 816 from travelling into the fourth layer 810 ($p^-$ layer). The heavily doped $p^+$ layer 808 provides a plurality of positive charge carriers, leading to a recombination with the plurality of negative charge carriers, especially along the edges of the semiconductor die 820. Thus, the heavily doped third ($p^+$) layer 808 functions as a field stop layer, preventing the electric field from entering into the fourth lightly doped ($p^-$) layer 810. In this way, the third layer 808 prevents a generation of excess charge carrier generation in the fourth ($p^-$) layer 810 which leads to a reduction in the overall leakage current of the semiconductor die 820.

A crowding of an electric field at peripheries, i.e., edges of a semiconductor die 820 (due to sawing through semiconductor wafers to produce the semiconductor die 820) may lead to additional leakage current as well as premature voltage breakdown, which adversely affects the breakdown voltage capability of the semiconductor die 820. To minimize premature voltage breakdown at peripheries of the semiconductor die 820, edges of the semiconductor die 820 are shown as beveled in order to reduce or prevent the electric field crowding at the peripheries of the semiconductor die 820. The process of beveling includes a removal of semiconductor material at the edges of the wafer at a precisely controlled angle, herein shown as angle α. The beveling of the edges enhances the breakdown voltage by reducing the electric field at the edges, thereby preventing any leakage current.

The semiconductor die 820 described in FIG. 10 is a symmetrical semiconductor die, i.e., the reverse breakdown voltage for the first junction 816 is same as the reverse breakdown voltage of the second junction 818 of the semiconductor die 820. In other words, a concentration of dopants and a thickness of the second layer 806 is approximately equivalent to a concentration of dopants and a thickness of the fourth layer 810 leading to the symmetrical semiconductor die 820. An operation of the semiconductor die 820 with a reverse polarity of the voltage supply source is now described. A reverse polarity of the voltage supply source 904 refers to changing the positive and negative bias of the voltage supply source. In this embodiment, the positive bias 906 is applied to the fifth layer 812 and the negative bias 908 is applied to the first layer 804. It is to be noted that this combination of positive 906 and negative bias 908 is opposite to the combination described above where a positive bias 906 is connected to the first layer 804 and the negative bias 908 is connected to the fifth layer 812.

In such an embodiment, however, under the effect of the biasing, the second junction 818 between the fourth layer 810 and the fifth layer 812 is reverse biased, and therefore, suffers an avalanche breakdown, when the semiconductor die 820 experiences a transient voltage surge from the voltage supply source 904. A plurality of free charge carriers, including negative charge carriers as well as positive charge carriers, are generated at the second junction 818 due to the avalanche breakdown. The negative charge carriers thus generated move towards the fifth layer 812 under the influence of the positive bias 906. The positive charge carriers thus generated move towards the fourth layer 810.

Simultaneously, the first junction 816 experiences a forward bias. Hence, the negative charge carriers from the first layer 804 of $n^+$ type move towards the second layer 806 of $p^+$ type and eventually towards the fifth layer 812. Some of the negative charge carriers recombine with the positive charge carriers in the second layer 806, the third layer 808, the fourth layer 810, and the fifth layer 812.

Similarly, the positive charge carriers generated at the second junction 818 due to the avalanche breakdown, travel towards the first layer 804 under the influence of the negative bias 908. Some of the positive charge carriers recombine with the charge carriers of opposite charge conductivity, herein negative charge carriers, in the fourth layer 810, the third layer 808, the second layer 806, and the first layer 804. Thus, the semiconductor die 820 provides a low resistance path to the current flow in case of a voltage surge condition.

In the illustrated embodiment, the semiconductor die 820 is a symmetrical die, as described above. Therefore, even on reversing a polarity of the voltage supply source 904, the second junction 818 experiences an avalanche breakdown at the same voltage as the first junction 816. However, in case of the semiconductor die 820 is an asymmetrical die, the first junction 816 experiences a breakdown at a different voltage relative to the second junction 818.

Further, consider the following scenario when the semiconductor die 820 is an asymmetrical semiconductor die: In a first orientation, the polarity of the voltage supply source 904 is such that the positive bias 906 is coupled to the first layer 804 and the negative bias 908 is coupled to the fifth layer 812. Further, the first junction 816 is designed to break down at a voltage V1 and the second junction 818 is designed to break down at a voltage V2, where V2 is greater than V1. Assuming that in the presence of a voltage V, the first junction 816 experiences a reverse breakdown voltage V1, while the second junction 818, being forward biased, conducts current, enabling the transient voltage suppressor 206 to provide a low resistance path for the current flow.

In a second orientation, the polarity of the voltage supply source 904 is reversed. In other words, the positive bias 906 is coupled to the fifth layer 812 and the negative bias 908 is coupled to the first layer 804. Now, in the presence of voltage V, the second junction 818 experiences a voltage of V1 which is less than the reverse breakdown voltage V2 of second junction 816. In this case, the transient voltage suppressor 206 does not provide a conduction path for the current flow. For the transient voltage suppressor 206 to be conducting in such a circumstance, a voltage (spike) experienced by the junction 818 should be greater than V1. In other words, such an orientation of the transient voltage suppressor 206 may be used for protection only against higher voltage transients compared to the first orientation.

The asymmetrical transient voltage suppressor(s) 206 are particularly helpful in scenarios when the transient voltage suppressor(s) 206 are required to conduct current only during a particular polarity of the voltage supply source 904 or conduct at different voltages under different polarities of the voltage supply source 904. As noted above, under these circumstances, a second junction (other than a first junction), is designed to possess a higher breakdown voltage compared to the first junction.

FIG. 11 shows a distribution of an electric field 822 in the semiconductor die 820 of the transient voltage suppressor 206 when the first junction 816 between the first layer 804 and the second layer 806 is reverse biased, and the second junction 818 between the fourth layer 810 and the fifth layer 812 is forward biased. The x-axis represents a thickness of each of the layers 804, 806, 808, 810, 812, whereas the y-axis represents a doping concentration in the layers 804, 806, 808, 810, 812. It should be noted herein that any variation in the doping concentration and the thickness in mutually adjacent layers will affect a breakdown voltage of a junction between the mutually adjacent layers. As shown in the FIG. 11, the third layer 808 of the p$^+$ type acts as a field stop layer by constraining an electric field to the third layer 808, thereby preventing a generation of excess charge carriers in the fourth layer 810 and the fifth layer 812.

FIG. 12 shows a distribution of an electric field 824 in the semiconductor die 820 of the transient voltage suppressor 206 when the first junction 816 between the first layer 804 and the second layer 806 is forward biased and the second junction 818 between the fourth layer 810 and the fifth layer 812 is reverse biased. The x-axis represents a thickness of each of the layers 804, 806, 808, 810, 812, whereas the y-axis represents a doping concentration in the layers 804, 806, 808, 810, 812. As shown in the FIG. 12, the third layer 808 of the p$^+$ type acts as a field stop layer by constraining an electric field to the third layer 808, thereby preventing a generation of excess charge carriers in the second layer 806 and the first layer 804.

FIG. 13 shows a transient voltage suppressor 1000 in accordance with another embodiment of the present invention. In the illustrated embodiment, the transient voltage suppressor 1000 includes a semiconductor die 1220 having a first layer 1204, a second layer 1206, a third layer 1208, a fourth layer 1210, a fifth layer 1212, and two metal layers 1202, 1214. The layers 1204, 1206, 1208, 1210, 1212 may be constituted of any semiconductor material such as a wide band semiconductor material. Further, the first layer 1204 has a conductivity of n$^+$ type. The second layer 1206 is stacked between the first layer 1204 and the third layer 1208 and has a conductivity of p$^+$ type. The third layer 1208 is stacked between the second layer 1206 and the fourth layer 1210 and has a conductivity of p$^-$ type. The fourth layer 1210 is stacked between the third layer 1208 and the fifth layer 1212 and has a conductivity of p$^+$ type. The fifth layer 1212 is stacked above the fourth layer 1210 and has a conductivity of n$^+$ type.

The semiconductor die 1220 of the transient voltage suppressor 1000 further includes a first junction 1216 formed between the heavily doped n$^+$ type first layer 1204 and a heavily doped p$^+$ type second layer 1206. A second junction 1218 exists between the heavily doped p$^+$ type fourth layer 1210 and the heavily doped n$^+$ type fifth layer 1212. The semiconductor die 1220 may be a symmetrical device with similar breakdown voltages for both the first junction 1216 and the second junction 1218 or an asymmetrical device with different breakdown voltages for the first junction 1216 and the second junction 1218.

In one particular embodiment, a semiconductor die is a mirror-image of the semiconductor die 1220 illustrated in FIG. 13. That is, the mirror-image semi-conductor die includes a first layer and a fifth layer constituted of a p$^+$ type conductivity layer, a second layer and a fourth layer constituted of an n$^+$ type conductivity layer, and a third layer constituted of a n$^-$ type conductivity layer. Similar to the semiconductor die 1220, the mirror-image of the semiconductor die 1220 has the first layer, the second layer, the third layer, the fourth layer, and the fifth layer arranged sequentially to form a structure.

Further, an operation of the semiconductor die 1220 of the transient voltage suppressor 1000 is similar to the operation described with reference to FIG. 10. It is to be noted that an operation of the mirror-image of the semiconductor die 1220 may be similar to the operation of the semiconductor die 1220. In particular, in the semiconductor die 1220, in the presence of a voltage surge, one of the first junction 1216 or the second junction 1218 experiences a reverse bias resulting in a break down and generation of an avalanche current, whereas the other junction is forward biased.

However, in this particular embodiment, the first layer 1204 and the second layer 1206 are heavily doped n and p layers, respectively. Therefore, the first junction 1216 between the layers 1204, 1206, has a smaller width requiring a lower breakdown voltage. Similarly, the fourth layer 1210 and the fifth layer 1212 are heavily doped p and n layers respectively. Therefore, the second junction 1218 between the layers 1210, 1212, has a smaller width requiring a lower breakdown voltage.

When the suppressor 1000 is subjected to a reverse breakdown voltage, one of the junctions 1216, 1218 experience an avalanche current leading to a generation of a large number of charge carriers (both positive and negative carriers). Under the influence of the biasing, the positive and negative charge carriers thus generated move in mutually opposing directions. Simultaneously, the other junction experiences a forward bias condition.

In view of these junction biasing, the charge carriers of one charge conductivity move from the first layer 1204 towards the fifth layer 1212. While moving, these charge carriers may combine with the charge carriers of opposite charge conductivity in the intervening layers, for example, the second layer 1206, the third layer 1208, and the fourth layer 1210, before reaching the fifth layer 1212. Owing to the low breakdown voltage(s) of the junctions 1216, 1218, the suppressor 1000 provides a low resistance path for the flow of current, thus providing protection against minor voltage spikes or transients.

The third layer 1208 (lightly doped p layer) helps to reduce the leakage current by acting as a trap for the charge carriers. The third layer 1208 provides positive charge carriers for the recombination of a large number of electrons generated at the forward biased junction of the transient voltage suppressor 1000. In particular, side walls of the third layer 1208 act as a recombination region, where a majority of negative charge carriers recombine leading to a reduction in the leakage current. The transient voltage suppressor 1000 described in FIG. 13 is typically suitable for systems where even small voltage transients may be harmful for the operation of the system.

FIG. 14 shows a plot illustrating variation of doping concentration versus layer thickness for the transient voltage suppressor 1000 of FIG. 13, having a symmetrical structure. The x-axis represents a thickness of each of the layers 1204, 1206, 1208, 1210, 1212. The y-axis represents a doping concentration in each of the layers 1204, 1206, 1208, 1210, 1212. In the illustrated example, the first layer 1204, the second layer 1206, the fourth layer 1210, and the fifth layer 1212 have the same thickness (for example, 0.5 units) whereas the third layer has an exemplary thickness of 1 unit. Further, FIG. 14 shows each of the layers 1204, 1206, 1208, 1210 as bars labeled as n$^+$, p$^+$, p$^-$, p$^+$, and n$^+$ respectively. A doping concentration of each layer amongst the layers 1204, 1206, 1208, 1210, 1212 may be determined by extrapolating a height of each bar corresponding to each layer 1204, 1206, 1208, 1210, 1212 on the y-axis. For example, the bars corresponding to the first layer 1204 and the fifth layer 1212 have the height h1, the bars corresponding to the second layer 1206 and the fourth layer 1210 have the height h2, and the bar corresponding to the third layer 1208 has a height h3. Accordingly, a doping concentration for the first layer 1204 and fifth layer 1212 is same. In one embodiment, a doping concentration of the first layer 1204 and the fifth layer 1210 is 2e19/cm$^3$, the doping concentration of the second layer 1206 and the fourth layer 1208 is 4e18/cm$^3$, the doping concentration of the third layer is 1e16/cm$^3$. As evident, the doping concentrations of the second layer 1206 and the fourth layer 1210 are the same. Such a configuration with same layer thickness and doping concentration of the second layer 1206 and the fourth layer 1210 has identical breakdown voltages for the junctions between the first layer 1204 and the second layer 1206, and between the fourth layer 1210 and the fifth layer 1212.

Further, FIG. 15 shows a plot illustrating variation of doping concentration versus layer thickness for the transient voltage suppressor 1000 of FIG. 13 having an asymmetrical structure. The x-axis represents a thickness of each of the layers 1204, 1206, 1208, 1210, 1212. The y-axis represents a doping concentration in each of the layers 1204, 1206, 1208, 1210, 1212. In the exemplary illustrated embodiment, the first layer 1204 and the second layer 1206 have the same thickness of 0.5 micrometers, the third layer 1208 is shown to have a thickness of 1 micrometer, the fourth layer is shown to have a thickness of 0.8 micrometers, and the fifth layer 1212 is shown to have a thickness of 3-4 micrometers. Similar to FIG. 14, FIG. 15 shows each of the layers 1204, 1206, 1208, 1210 as bars labeled as $n^+$, $p^+$, $p^-$, $p^+$, and $n^+$ respectively. A doping concentration of each layer amongst the layers 1204, 1206, 1208, 1210, 1212 may be determined by extrapolating a height of each bar corresponding to each layer 1204, 1206, 1208, 1210, 1212 on the y-axis. For example, the bars corresponding to the first layer 1204 and the fifth layer 1212 have the height h1, the bars corresponding to the second layer 1206 has a height h2, the bar corresponding to the third layer 1208 has a height h3, and the bar corresponding to the fourth layer 1210 has a height h4. In one embodiment, a doping concentration of the first layer 1204 and the fifth layer 1210 is $2e19/cm^3$, the doping concentration of the second layer 1206 is $4e18/cm^3$, the doping concentration of the third layer is $1e16/cm^3$, and the doping concentration of the fourth layer $4e19/cm^3$. Accordingly, the doping concentrations of the second layer 1206 and the fourth layer 1210 are different, as represented by the height of the respective vertical bars corresponding to the second layer 1206 (having a height h2) and the fourth layer 1210 (having a height h4). The above described configuration with one or more of a different thickness and a different doping concentrations for the second layer 1206 and the fourth layer 1210 leads to different breakdown voltages for the junctions between the first layer 1204 and the second layer 1206, and between the fourth layer 1210 and the fifth layer 1212.

FIG. 16 shows a graph associated with determining a doping concentration of the lightly doped p layers 1206, 1210 for the transient voltage suppressor 1000 (shown in FIG. 13) for determining a breakdown voltage for the respective junctions 1216, 1218 (shown in FIG. 13) associated with these layers 1206, 1210. FIG. 16 graphically represents relation between a concentration of dopants $ND(U_{BD})$ in a second layer 1206 or fourth layer 1210 of the semiconductor die 1220 of FIG. 13 on the left y-axis, and a breakdown voltage $[U_{BD}]$ of a junction corresponding to the layers 1206, 1210 on x-axis, and a width of the junction (or the depletion layer) $[W(U_{BD})/10^{-4}]$ for which breakdown voltage is being determined on the right y-axis. As is indicated by the graph, a doping concentration of the second layer 1206 or the fourth layer 1210 (of the lightly doped p type) of the transient voltage suppressor 1000 is always greater than a width of the first junction.

For the transient voltage suppressor having a semiconductor layer structure as described for FIG. 13, a doping concentration for obtaining a particular junction breakdown voltage is determined as follows:

$ND(U_{BD}) = (3 \times 10^{15}/U_{BD})^{4/3}$, where $ND(U_{BD})$, represents a concentration of dopants in the second layer 1206 or the fourth layer 1210 depending upon the junction for which breakdown voltage is being determined, and $U_{BD}$ represents a breakdown voltage corresponding to the concentration of dopants. It is understood by one of ordinary skill in the art that the above equation for determining a doping concentration corresponding to a breakdown voltage is only exemplary and not limiting. Any other suitable method for determining a doping concentration relative to a breakdown voltage may be employed.

FIG. 17 represent a graphical comparison of a current (I) versus voltage (V) graph for an ideal transient voltage suppressor. The x-axis represents a supply voltage across the voltage suppressor, while the y-axis represents a current flowing through the voltage suppressor in response to experiencing the supply voltage.

As shown in FIG. 17, an ideal transient voltage suppressor experiences a sharp forward bias current on reaching a forward breakdown voltage $U_{BD}$ (J1) at a first junction J1. Further, the ideal transient voltage suppressor experiences a sharp reverse bias current on experiencing a reverse breakdown voltage $U_{BD}$ (J2) at a second junction J2. As such, an ideal transient voltage suppressor is shown to have no leakage currents.

Turning now to FIG. 18, a current (I) versus voltage (V) graph for a symmetrical transient voltage suppressor in accordance with the present invention is shown. As previously described with reference to FIG. 8, a symmetrical transient voltage suppressor such as the transient voltage suppressor 206 has the same doping concentration and thickness for the second layer 806 and the fourth layer 810. As shown, the I-V graph possesses almost ideal characteristics for the forward bias voltage $U_{BD}$ (J1) as well as at reversed bias voltage $U_{BD}$ (J2), where sharp avalanching curve is obtained. This is because the field stop layer of the transient voltage suppressor reduces the leakage current, thereby preventing any soft breakdown of the transient voltage suppressor. Similarly, the lightly doped p layer of the transient voltage suppressor also reduced the field crowding effect, preventing leakage current to obtain sharp avalanching current at reverse bias. Thus, the transient voltage suppressor device present more ideal I-V characteristics compared to the conventional transient voltage suppressor device. Also, because of the proposed material of the semiconductor layers as well as the layout of the semiconductor layers in the transient voltage suppressor device, these may be utilized at temperatures as high as 250 degree Celsius to 300 degree Celsius or even greater.

Turning now to FIG. 19, a current (I) versus voltage (V) graph for an asymmetrical transient voltage suppressor in accordance with the present invention is shown. Asymmetrical transient voltage suppressor such as the transient voltage suppressor 1000 shown in FIG. 15 has a different doping concentration and thickness for the second layer 806 and the fourth layer 810. As shown in FIG. 19, a sharp avalanching curve is obtained at the reverse breakdown voltage $U_{BD}$ (J2) as well as the forward breakdown voltage $U_{BD}$ (J1). Again, the asymmetrical transient voltage suppressor 1000 presents more ideal I-V characteristics compared to the conventional transient voltage suppressor.

Furthermore, the skilled artisan will recognize the interchangeability of various features from different embodiments. Similarly, the various method steps and features described, as well as other known equivalents for each such methods and feature, can be mixed and matched by one of ordinary skill in this art to construct additional systems and techniques in accordance with principles of this disclosure. Of course, it is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A semiconductor die, comprising:
a substrate comprising a first layer of a first wide band gap semiconductor material having a first conductivity;
a second layer of a second wide band gap semiconductor material having a second conductivity different from the first conductivity, in electrical contact with the first layer;
a third layer of a third wide band gap semiconductor material having a third conductivity different from the first conductivity and second conductivity, in electrical contact with the second layer;
a fourth layer of a fourth wide band gap semiconductor material having the second conductivity, and in electrical contact with the third layer; and
a fifth layer of a fifth wide band gap semiconductor material having the first conductivity and in electrical contact with the fourth layer, wherein the first layer, the second layer, the third layer, the fourth layer, and the fifth layer are sequentially arranged to form a structure;
wherein at least one of the first wide band gap semiconductor material, the second wide band gap semiconductor material, the third wide band gap semiconductor material, the fourth wide band gap semiconductor material, and the fifth wide band gap semiconductor material are different materials.

2. The semiconductor die of claim 1, wherein the semiconductor die is configured to allow a current to flow through the semiconductor die when an applied voltage across the first layer and the fifth layer is greater than a threshold voltage.

3. The semiconductor die of claim 1, wherein the first wide band gap semiconductor material, the second wide band gap semiconductor material, the third wide band gap semiconductor material, the fourth wide band gap semiconductor material, and the fifth wide band gap semiconductor material are same materials.

4. The semiconductor die of claim 1, wherein the first layer and the fifth layer comprise an $n^+$ type conductivity layer.

5. The semiconductor die of claim 4, wherein the second layer and the fourth layer comprise a $p^-$ type conductivity layer, wherein the third layer comprises at least one of a $p^+$ type conductivity layer or a p type conductivity layer.

6. The semiconductor die of claim 4, wherein the second layer and the fourth layer comprise at least one of a $p^+$ type conductivity layer or a p type conductivity layer, wherein the third layer comprises a $p^-$ conductivity layer.

7. The semiconductor die of claim 1, wherein the first layer and the fifth layer comprise a $p^+$ type conductivity layer, the second layer and the fourth layer comprise a $n^-$ type conductivity layer, and the third layer comprises at least one of a $n^+$ type conductivity layer or a n type conductivity layer.

8. The semiconductor die of claim 1, wherein the first layer and the fifth layer comprise a $p^+$ type conductivity layer, the second layer and the fourth layer comprise a $n^+$ type conductivity layer, and the third layer comprises a $n^-$ type conductivity layer.

9. The semiconductor die of claim 1, wherein the first layer, the second layer, the third layer, the fourth layer, and the fifth layer comprise at least one of silicon carbide (SiC), gallium nitride (GaN), Aluminum Nitride (AlN), Boron Nitride (BN), and diamond.

10. The semiconductor die of claim 1, wherein the structure comprises a mesa structure with beveled walls, wherein the beveled walls are inclined at an angle ranging from 2 degrees to less than 90 degrees with respect to an interface between adjacent layers among the first, the second, the third, the fourth, and the fifth layers of the structure.

11. The semiconductor die of claim 1, wherein the structure comprises walls inclined at an angle of 90 degrees with respect to an interface between adjacent layers among the first, the second, the third, the fourth, and the fifth layers of the structure.

12. The semiconductor die of claim 1, wherein the semiconductor die is configured to allow a current to flow through the semiconductor die by an avalanche breakdown at a first junction between the first layer and the second layer when a negative bias is applied to the first layer and a positive bias is applied to the fifth layer.

13. The semiconductor die of claim 12, wherein the semiconductor die is configured to allow the current to flow through the semiconductor by a forward biasing of a second junction between the fourth layer and the fifth layer when the negative bias is applied to the first layer and the positive bias is applied to the fifth layer.

14. The semiconductor die of claim 1, wherein the semiconductor die is configured to allow a current to flow through the semiconductor die by an avalanche breakdown at a first junction between the fourth layer and the fifth layer when a negative bias is applied to the fifth layer and a positive bias is applied to the first layer.

15. The semiconductor die of claim 14, wherein the semiconductor die is configured to allow the current to flow through the semiconductor by a forward biasing of a second junction between the first layer and the second layer when the negative bias is applied to the fifth layer and the positive bias is applied to the first layer.

16. A method for suppressing a transient voltage, the method comprising:
detecting an applied voltage greater than a threshold voltage across a semiconductor die, wherein the semiconductor die includes a first layer of a first conductivity, a second layer of a second conductivity, a third layer of a third conductivity, a fourth layer of the second conductivity, and a fifth layer of the first conductivity;
detecting a reverse breakdown voltage across the first layer and the second layer in response to detecting the applied voltage;
generating a first plurality of charge carriers at a junction between the first layer and the second in response to detecting the reverse breakdown voltage;
moving a first set of charge carriers among the first plurality of charge carriers towards the fifth layer;
detecting a forward bias voltage across the fourth layer and the fifth layer;
moving a second set of charge carriers from the fifth layer towards the first layer in response to detecting the forward bias; and
absorbing the first set of charge carriers and the second set of charge carriers in at least one of the first layer, the second layer, the third layer, the fourth layer, and the fifth layer; wherein the first layer, the second layer, the third layer, the fourth layer, and the fifth layer are disposed sequentially to form a structure.

17. The method of claim 16, wherein the applied voltage comprises a positive bias applied at the fifth layer and a negative bias applied at the first layer.

18. The method of claim 17, wherein a thickness of the third layer is greater than a thickness of a junction between the first layer and the second layer.

19. The method of claim 17, further comprising:
determining a voltage across a junction between the first layer and the second layer based upon the applied voltage;
performing an avalanche breakdown at the junction when the voltage is equal to the reverse breakdown voltage.

20. The method of claim 16, further comprising:
generating an electric field in at least one of the first, the second, and the third layers based upon the applied voltage; and
preventing a penetration of the electric field into the fourth layer based upon the absorption of at least one charge carrier generated at the junction between the first layer and the second layer and at least one sidewall of the third layer.

21. The method of claim 16, wherein the third layer absorbs at least one charge carrier generated at a side wall of the structure, thereby controlling an electrical leakage current from the semiconductor die.

22. A method for forming a transient voltage suppressor, the method comprising:
providing a substrate comprising a first wide band gap semiconductor material;
diffusing a dopant of a first conductivity type into the substrate to obtain a first layer of a first conductivity;
forming a second layer of a second wide band gap semiconductor material having a second conductivity over at least a portion of the first layer;
forming a third layer of a third wide band gap semiconductor material having a third conductivity over at least a portion of the second layer;
forming a fourth layer of a fourth wide band gap semiconductor material having the second conductivity over at least a portion of the third layer;
forming a fifth layer of a fifth wide band gap semiconductor material having the first conductivity over at least a portion of the fourth layer;
controlling a first breakdown voltage of a first junction between the first layer and the second layer; and
controlling a second breakdown voltage of a second junction between the fourth layer and the fifth layer.

23. The method of claim 22, further comprising:
determining at least one of a first concentration of dopants in the first layer, a second concentration of dopants in the second layer, a first thickness of the first layer, and a second thickness of the second layer to control the first breakdown voltage of the first junction between the first layer and the second layer; and
determining at least one of a first concentration of dopants in the fourth layer, a second concentration of dopants in the fifth layer, a first thickness of the fourth layer, and a second thickness of the fifth layer to control the second breakdown voltage of the second junction between the fourth layer and the fifth layer.

24. The method of claim 23, wherein the first breakdown voltage is different from the second breakdown voltage.

25. The method of claim 23, wherein the first breakdown voltage is the same is as the second breakdown voltage.

26. The method of claim 23, further comprising:
bonding a first electrode to the first layer and a second electrode to the fifth layer using at least one of a thermocompression bond, a transient liquid phase solder bond, a gold layer, and an alloyed layer.

27. An electronic system comprising:
at least one electronic unit;
a protection device electrically coupled to the at least one electronic unit, wherein the protective device comprises:
a semiconductor die having a structure, the semiconductor die comprising:
a substrate comprising a first layer of a first wide band gap semiconductor material having a first conductivity;
a second layer of a second wide band gap semiconductor material having a second conductivity different from the first conductivity, in electrical contact with the first layer;
a third layer of a third wide band gap semiconductor material having a third conductivity different from the first conductivity and the second conductivity, in electrical contact with the second layer;
a fourth layer of a fourth wide band gap semiconductor material having the second conductivity in electrical contact with the third layer; and
a fifth layer of a fifth wide band gap semiconductor material having the first conductivity in electrical contact with the fourth layer, wherein a first terminal of the protection device is electrically coupled to the substrate and a second terminal of the protection device is electrically coupled to the fifth layer;
wherein the structure comprises a mesa structure with beveled walls, wherein the beveled walls are inclined at an angle ranging from 2 degrees to less than 90 degrees with respect to an interface between adjacent layers among the first, the second, the third, the fourth, and the fifth layers of the structure.

28. The electronic system of claim 27, wherein the protective device further comprises:
a first electrode electrically coupled to the substrate; and
a second electrode electrically coupled to the fifth layer.

29. The electronic system of claim 28, wherein the protective device further comprises:
an encapsulation at least partially surrounding the semiconductor die, the first electrode, and the second electrode, wherein the encapsulation is at least one of a glass or ceramic encapsulation.

* * * * *